United States Patent
Li et al.

(10) Patent No.: US 11,369,032 B2
(45) Date of Patent: Jun. 21, 2022

(54) FRAME STRUCTURE AND SERVER HAVING SAME

(71) Applicant: Fulian Precision Electronics (Tianjin) Co., LTD., Tianjin (CN)

(72) Inventors: Zhen-Lei Li, Tianjin (CN); Wen-Hu Lu, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 15 days.

(21) Appl. No.: 16/918,161

(22) Filed: Jul. 1, 2020

(65) Prior Publication Data

US 2021/0368645 A1  Nov. 25, 2021

(30) Foreign Application Priority Data

May 19, 2020 (CN) .......................... 202010426492.6

(51) Int. Cl.
*H05K 7/14* (2006.01)
*H05K 5/02* (2006.01)
*F16B 1/00* (2006.01)

(52) U.S. Cl.
CPC .......... *H05K 7/1489* (2013.01); *H05K 5/023* (2013.01); *F16B 1/0071* (2013.01); *F16B 2001/0092* (2013.01)

(58) Field of Classification Search
None
See application file for complete search history.

(56) References Cited

U.S. PATENT DOCUMENTS

| 9,609,778 B1 * | 3/2017 | Spencer | H05K 7/1489 |
| 10,168,747 B2 * | 1/2019 | Zhu | H05K 7/1489 |
| 2017/0347481 A1 | 11/2017 | Kuan et al. | |
| 2020/0375054 A1 * | 11/2020 | Pham | H05K 7/1487 |

FOREIGN PATENT DOCUMENTS

| CN | 206773619 U | 12/2017 |
| CN | 209949696 U | 1/2020 |
| TW | M537777 U | 3/2017 |
| TW | 201742528 A | 12/2017 |

* cited by examiner

*Primary Examiner* — James Wu
*Assistant Examiner* — Christopher L Augustin
(74) *Attorney, Agent, or Firm* — ScienBiziP, P.C.

(57) ABSTRACT

A frame structure includes a first frame, a rail, a handle, a buckle, a second frame, and buffer members. The first frame includes a bottom plate and side plates. The bottom plate and the side plates define an accommodation space. The rail is located on each of the side plates. One end of the handle is movably disposed on the rails. The buckle is located on the first frame and detachably fastened with the handle. The second frame is movably received in the accommodation space. One end of each buffer member is fixed to a bottom surface of the second frame, and another end resists the bottom plate. The handle is coupled to the second frame. When the handle is separated from the buckle, the handle is pushed or pulled to remove the second frame from the accommodation space or press the second frame into the accommodation space.

16 Claims, 7 Drawing Sheets

FRAME STRUCTURE AND SERVER HAVING SAME

FIELD

The subject matter herein generally relates to the field of computing, and more particularly to a frame structure and a server having the frame structure.

BACKGROUND

A traditional server has multiple hard disk modules installed. A frame structure in the server is inconvenient for disassembly and assembly, and it is easy to impact the hard disk modules installed in the frame structure during disassembly and assembly for maintenance.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 1:
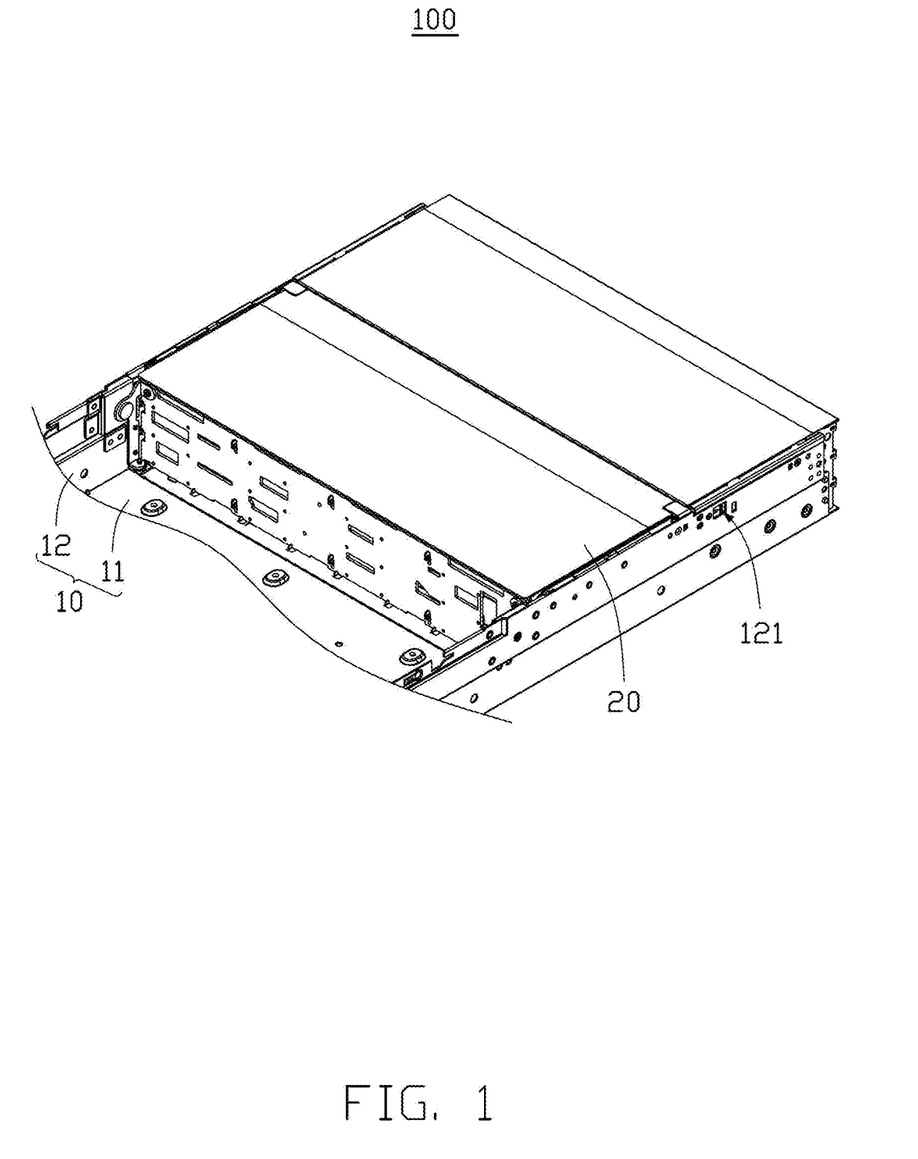
FIG. 1 is a structural schematic diagram of an embodiment of a frame structure in a closed state.
Figure 2:
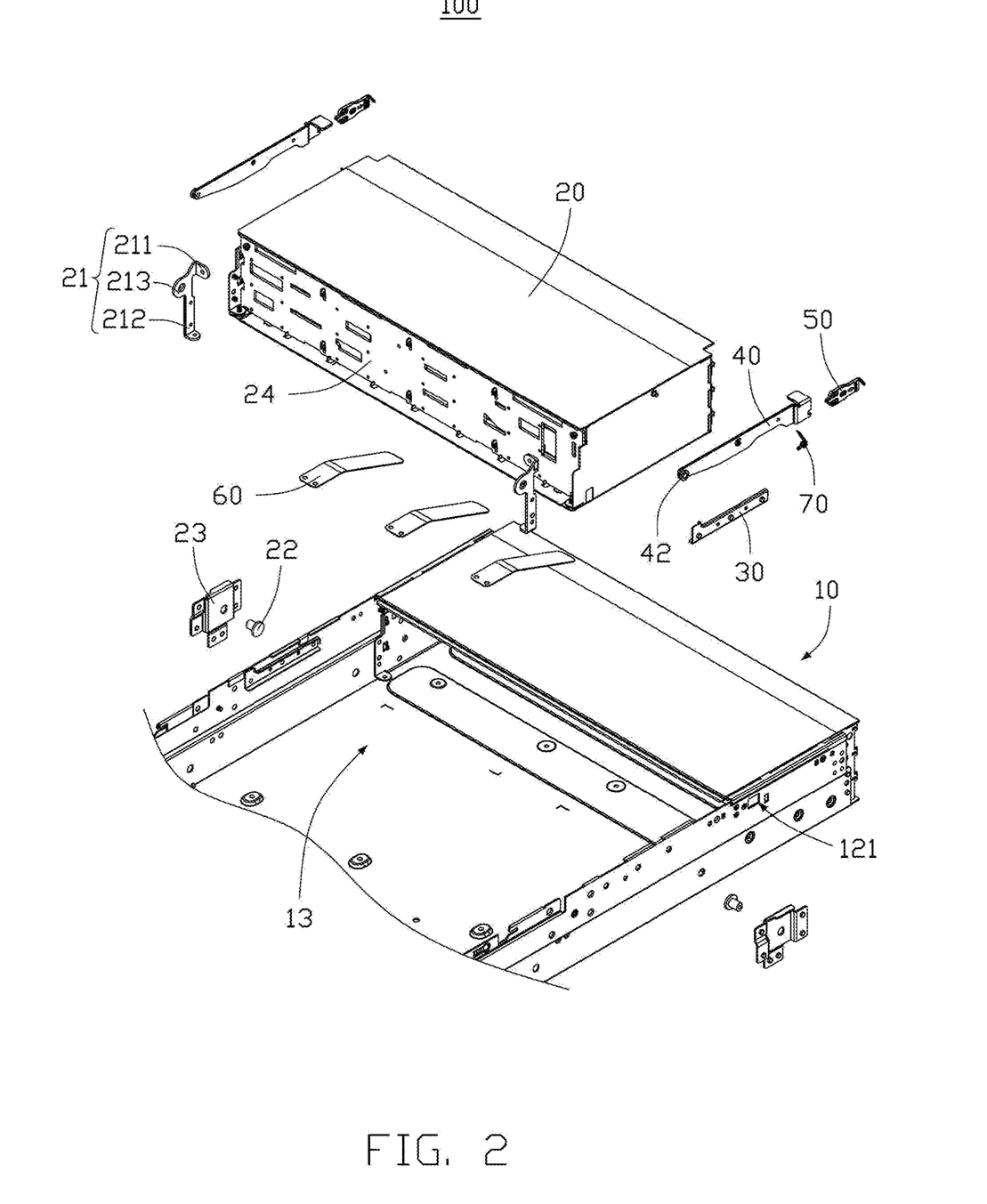
FIG. 2 is an exploded schematic view of the frame structure shown in FIG. 1.

Referring to FIGS. 1 and 2, an embodiment of a frame structure 100 includes a first frame 10, a second frame 20, a rail 30, a handle 40, a buckle 50, and a plurality of buffer members 60. The first frame 10 includes a bottom plate 11 and two opposite side plates 12. The bottom plate 11 and the side plates 12 cooperatively define an accommodation space 13. The second frame 20 is movably disposed in the accommodation space 13. The rail 30 is disposed on each of the two side plates 12. One end of the handle 40 is movably disposed on the two rails 30. The buckle 50 is disposed on the first frame 10 and detachably fastens the handle 40. Both the first frame 10 and the second frame 20 have a substantially rectangular parallelepiped shape. One end of each buffer member 60 is fixed to a bottom surface of the second frame 20, and the other end of each buffer member 60 extends away from the second frame 20.

When the buckle 50 is separated from the handle 40, the buffer members 60 apply an elastic force on the first frame 10 to separate the second frame 20 from the first frame 10. The handle 40 is connected to the second frame 20, and the handle 40 can be moved along the rails 30 by pushing and pulling the handle 40 to raise or press the second frame 20. When the second frame 20 is pressed down into the accommodation space 13, the ends of the buffer members 60 away from the second frame 20 resist the bottom plate 11 of the first frame 10 and generate an elastic force to buffer movement of the second frame 20 to prevent a hard disk module or other parts installed in the second frame 20 from being damaged due to impact, vibration, etc. In one embodiment, the buffer member 60 is an elastic sheet. In other embodiments, the buffer member 60 may be a spring, and is not limited thereto.

Figure 3:
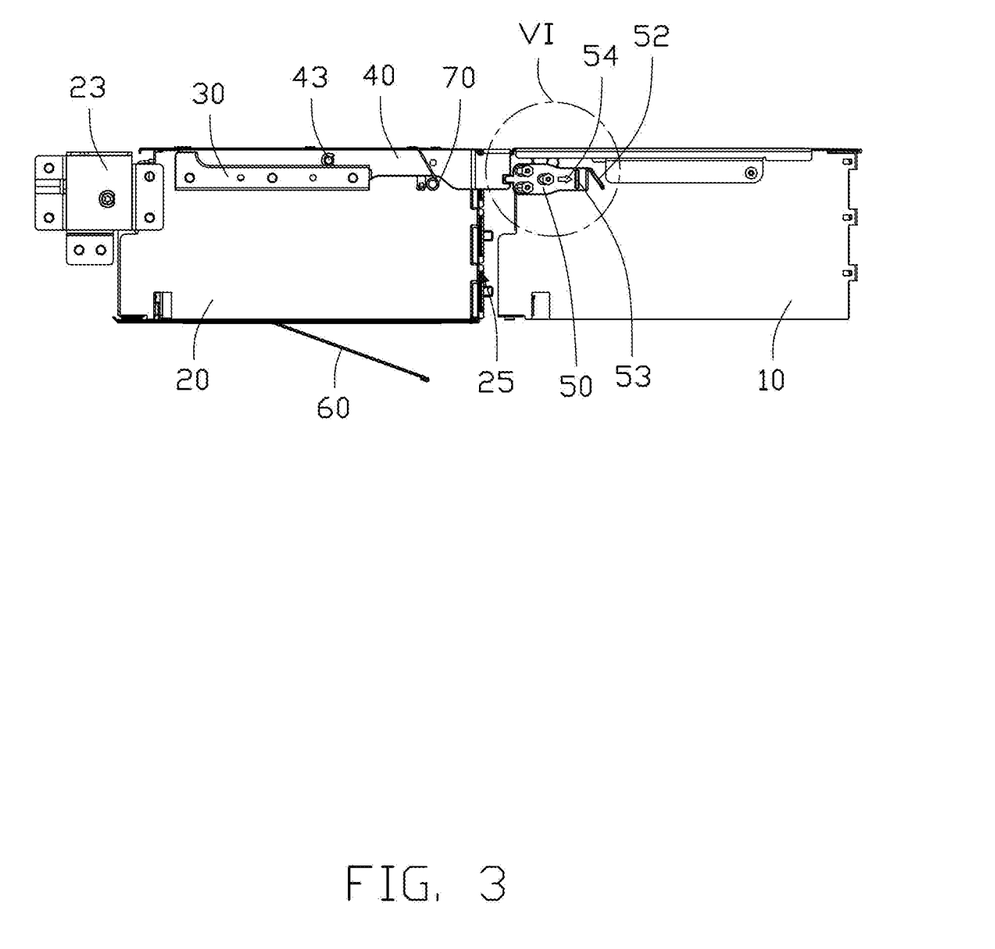
FIG. 3 is a side view of the frame structure shown in FIG. 1 in the closed state.

Referring to FIGS. 2 and 3, in order to clearly show a closed state of the second frame 20, the bottom plate 11 and the side plates 12 of the first frame 10 are not shown in FIG. 3. The frame structure 100 further includes a torsion spring 70. One end of the torsion spring 70 is connected to a side of the second frame 20, and the other end of the torsion spring 70 is detachably connected to the handle 40. When the second frame 20 is accommodated in the first frame 10, the handle 40 is also accommodated between the side of the second frame 20 and the side plate 12 of the first frame 10. The torsion spring 70 is connected to the handle 40 and the second frame 20, and the torsion spring 70 and the buffer members 60 are in a compressed state.

Further, the second frame 20 includes two first shaft brackets 21 and two rotating shafts 22. The first shaft bracket 21 is connected to an end of the second frame 20 away from the buckle 50, and rotationally connected to the corresponding side plate 12 of the first frame 10 through the rotating shaft 22, so that the second frame 20 can rotate relative to the first frame 10. The first shaft bracket 21 includes a first connecting portion 211, a second connecting portion 212, and a rotating portion 213. The first connecting portion 211 is connected to a front panel 24 of the second frame 20, and the second connecting portion 212 is connected to a bottom surface of a front end of the second frame 20. The rotating portion 213 is located between the first connecting portion 211 and the second connecting portion 212. The rotating portion 213 defines a through hole, and the rotating shaft 22 is inserted through the through hole. In one embodiment, the first connecting portion 211, the second connecting portion 212, and the rotating portion 213 are integrally formed.

The second frame 20 further includes two second shaft brackets 23 fixed on an inner side of each of the two side plates 12, respectively. The rotating portion 213 of the first shaft bracket 21 is rotationally connected to the second shaft bracket 23 through the rotating shaft 22, so that the second frame 20 rotates relative to the first frame 10 with the rotating shaft 22 as the center of rotation.

Figure 4:
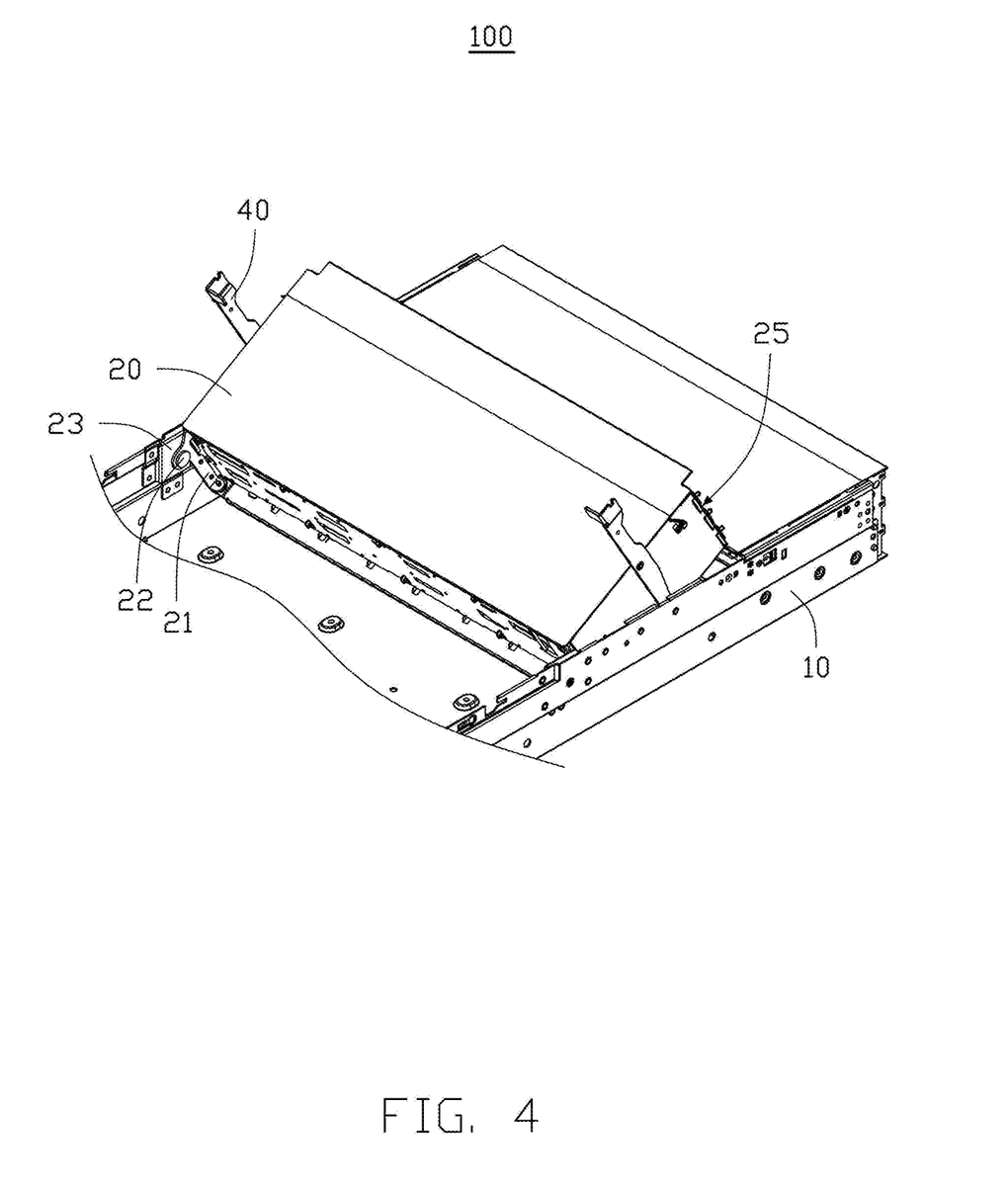
FIG. 4 is a schematic structural view of the frame structure shown in FIG. 1 in an open state.
Figure 5:
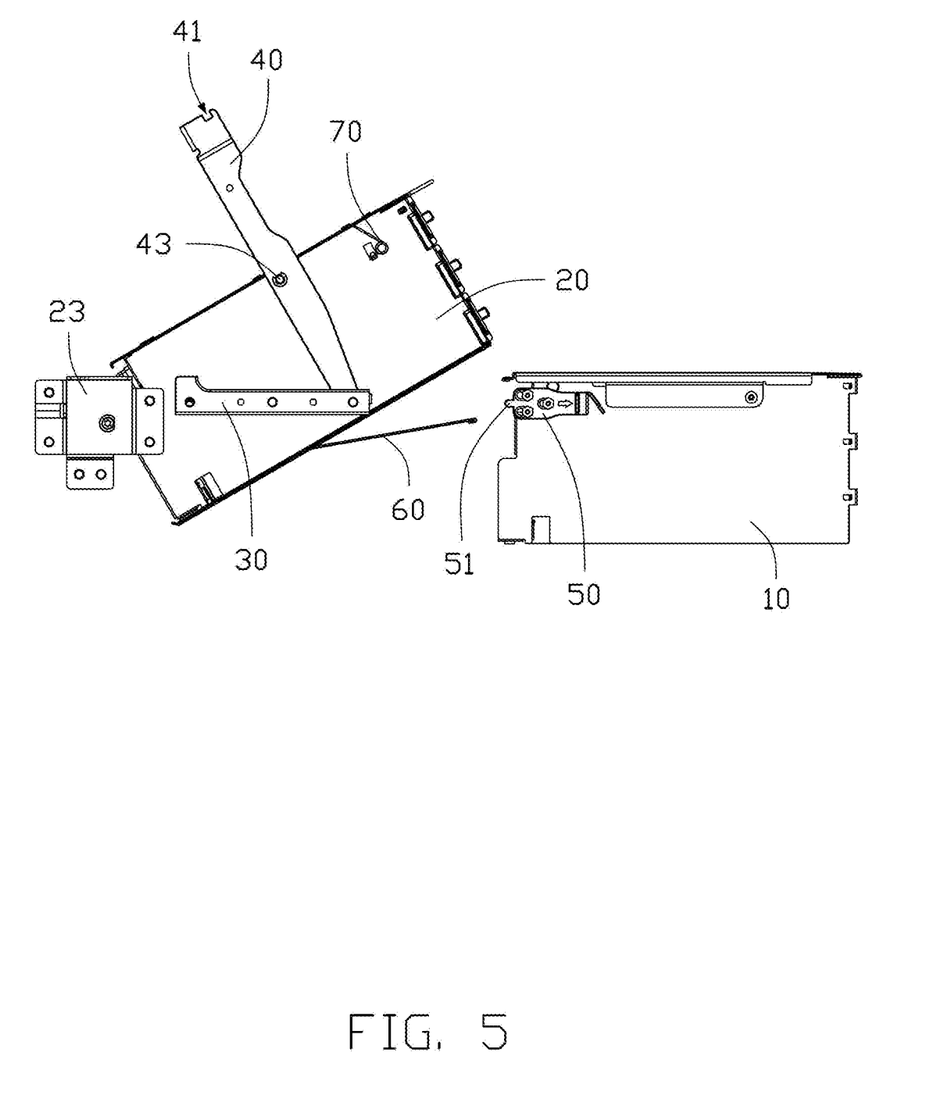
FIG. 5 is a side view of the frame structure shown in FIG. 4 in the open state.
Figure 6:
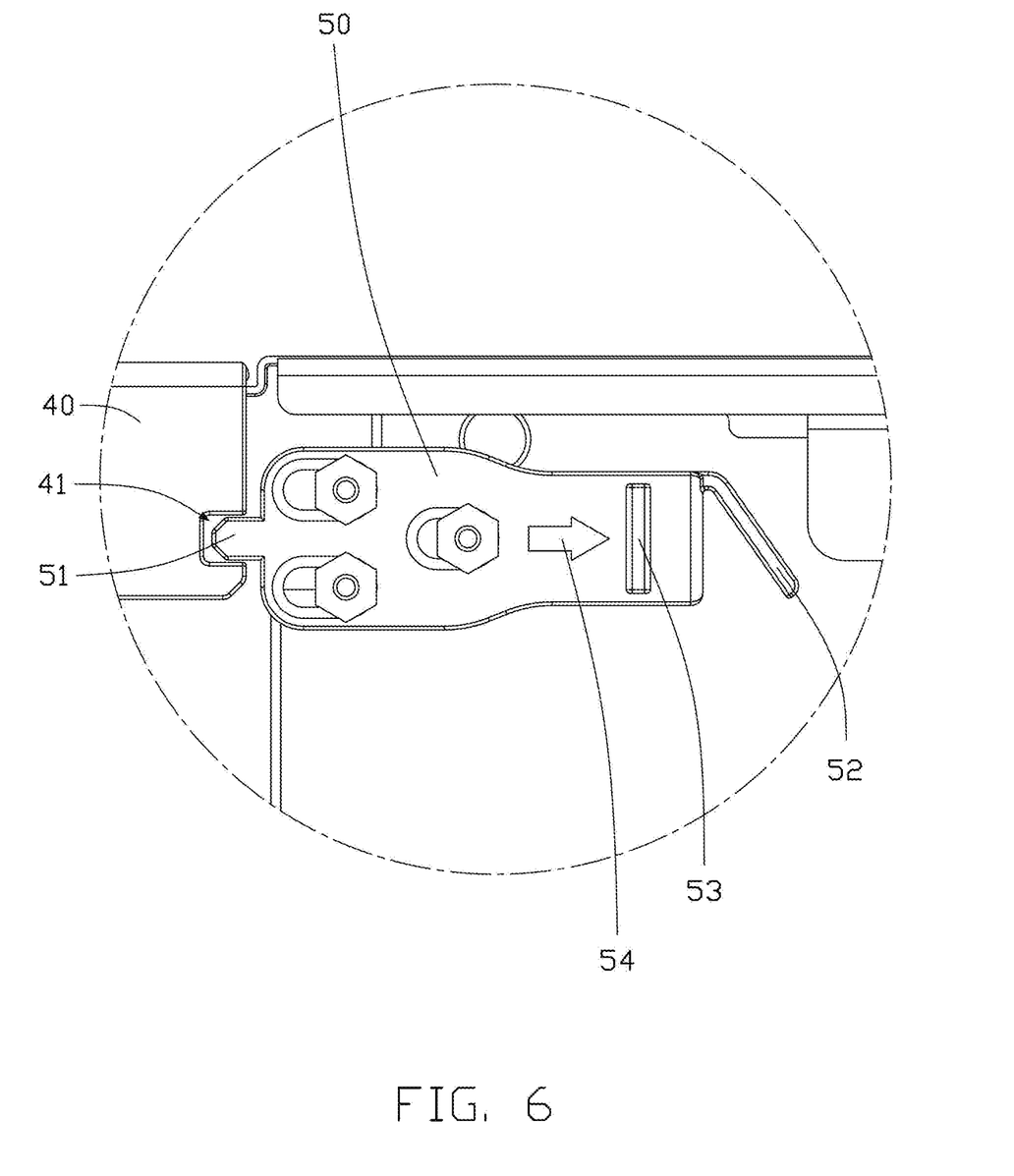
FIG. 6 is a partially enlarged view of circled portion VI in FIG. 3.

Referring to FIG. 4, FIG. 5, and FIG. 6, in order to clearly show an open state of the second frame 20, the bottom plate 11 and the side plates 12 of the first frame 10 are not shown in FIG. 5. A groove 41 is defined at an end of the handle 40 away from the rail 30, and the buckle 50 includes a protrusion 51 located at an end of the buckle 50 facing the handle 40. When the handle 40 is engaged with the buckle 50, the protrusion 51 is received in the groove 41. To unlock the handle 40 and the buckle 50, the buckle 50 is pushed to move the protrusion 51 out of the groove 41. After the handle 40 and the buckle 50 are unlocked, the second frame 20 and the handle 40 are partially ejected from the accommodation space 13 under the action of the buffer members 60 and the torsion spring 70. After the handle 40 is open at a certain angle, an operator or mechanical device may pull the handle 40 upwards to move the handle 40 along the rail 30 to drive the second frame 20 to rotate until a rear panel 25 of the second frame 20 is completely removed from the accommodation space 13, and the first frame 10 and the second frame 20 are in the open state, as shown in FIG. 4.

The end of the buckle 50 away from the protrusion 51 is provided with a restoring member 52. One end of the restoring member 52 is connected to the buckle 50, and the other end of the restoring member 52 abuts the first frame 10. When the handle 40 is engaged with the buckle 50, the restoring member 52 is used to maintain the buckled state of the buckle 50 and the handle 40 to prevent the protrusion 51 from sliding out of the groove 41. When the buckle 50 is separated from the handle 40, the buckle 50 can be automatically reset under the action of the restoring member 52. The buckle 50 further includes a pushing portion 53 protruding from a surface of the buckle 50 facing the side plate 12, and a through slot 121 (shown in FIGS. 1 and 2) corresponding to the pushing portion 53 is defined in the side plate 12, so that the buckle 50 can be directly pushed from outside of the side plate 12 to unlock the handle 40 and the second frame 20. Further, the surface of the buckle 50 facing the side plate 12 is provided with an indication arrow 54 for indicating an unlocking direction of the buckle 50. The indication arrow 54 is visible through the through slot 121.

Referring to FIGS. 2 and 5, the handle 40 further includes a roller 42 and a rotating shaft 43. The roller 42 is located at an end of the handle 40 connected to the rail 30. The roller 42 is disposed in the rail 30 so that the end of the handle 40 can move along the rail 30. The rotating shaft 43 is connected to the handle 40 and a side of the second frame 20. In one embodiment, the rotating shaft 43 is located approximately in the middle of the handle 40. When the second frame 20 moves out of the accommodation space 13, the roller 42 moves along the rail 30 toward the buckle 50, and at the same time, the handle 40 rotates counterclockwise, thereby driving the second frame 20 to rotate around the rotating shaft 22, and the rear panel 25 of the second frame 20 is raised up and moved out of the accommodation space 13. In one embodiment, the angle between the bottom surface of the second frame 20 and the bottom plate 11 of the first frame 10 is 0°-45°.

Figure 7:
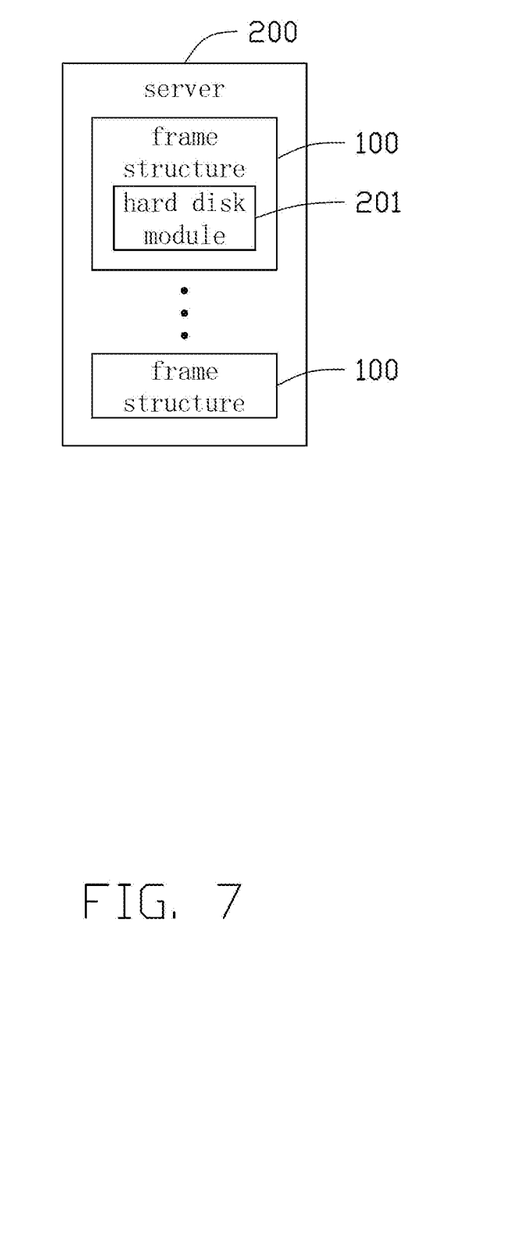
FIG. 7 is a structural block diagram of an embodiment of a server.

Referring to FIG. 1, FIG. 4, and FIG. 7, the present application further provides a server 200 and the frame structure 100, and a hard disk module 201 is installed on the frame structure 100. The number of the frame structures 100 and the hard disk modules 201 may be a plurality, and is not limited thereto. Specifically, the hard disk module 201 is installed in the second frame 20 of the frame structure 100. When the hard disk module 201 needs maintenance, the buckle 50 can be pushed to unlock the handle 40 and the second frame 20, and then the second frame 20 can be opened by pushing and pulling the handle 40, and the rear panel 25 is moved out of the first frame 10. Thus, repairing the hard disk module 201 is convenient.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:
1. A frame structure comprising:
   a first frame comprising a bottom plate and two oppositely disposed side plates, the bottom plate and the two side plates cooperatively defining an accommodation space;
   a rail located on each of the two side plates;
   a handle, one end of the handle movably disposed on the two rails;
   a buckle located on the first frame and detachably fastened with the handle;
   a second frame movably received in the accommodation space, the second frame comprising a first shaft bracket and a rotating shaft, the first shaft bracket coupled to an end of the second frame away from the buckle, and rotationally coupled to the corresponding side plate of the first frame through the rotating shaft; and
   a plurality of buffer members, one end of each of the plurality of buffer members fixed to a bottom surface of the second frame, and another end of each of the plurality of buffer members configured to resist the bottom plate; wherein:
   the handle is coupled to the second frame; and
   when the handle is separated from the buckle, the handle is pushed or pulled along the rails to remove the second frame from the accommodation space or press the second frame into the accommodation space.

2. The frame structure of claim 1, further comprising a torsion spring, wherein:
   one end of the torsion spring is coupled to a side of the second frame, and the other end of the torsion spring is detachably connected to the handle; and
   when the buckle is fastened to the handle, the torsion spring is in a compressed state.

3. The frame structure of claim 1, wherein:
   the first shaft bracket comprises a first connecting portion, a second connecting portion, and a rotating portion;
   the first connecting portion is coupled to a front panel of the second frame, and the second connecting portion is coupled to a bottom surface of a front end of the second frame;
   the rotating portion is located between the first connecting portion and the second connecting portion; and
   the rotating shaft is installed on the rotating portion.

4. The frame structure of claim 1, wherein:
   the second frame further comprises a second shaft bracket fixed on the corresponding side plate; and the first shaft bracket is rotationally coupled to the second shaft bracket through the rotating shaft.

5. The frame structure of claim 1, wherein:
a groove is in an end of the handle;
the buckle comprises a protrusion; and
when the handle is engaged with the buckle, the protrusion is received in the groove.

6. The frame structure of claim 5, wherein:
an end of the buckle away from the protrusion is provided with a restoring member; and
one end of the restoring member is coupled to the buckle, and the other end of the restoring member abuts the first frame.

7. The frame structure of claim 5, wherein:
the buckle further comprises a pushing portion and an indication arrow;
the pushing portion protrudes from a surface of the buckle facing the side plate; and
the indication arrow indicates an unlocking direction of the buckle.

8. The frame structure of claim 1, wherein:
the handle further comprises a roller located at an end of the handle coupled to the rail; and
the roller is movably disposed in the rail.

9. A server comprising:
a hard disk module; and
a frame structure, the hard disk module installed in the frame structure, the frame structure comprising:
  a first frame comprising a bottom plate and two oppositely disposed side plates, the bottom plate and the two side plates cooperatively defining an accommodation space;
  a rail located on each of the two side plates;
  a handle, one end of the handle movably disposed on the two rails;
  a buckle located on the first frame and detachably fastened with the handle;
  a second frame movably received in the accommodation space, the second frame comprising a first shaft bracket and a rotating shaft, the first shaft bracket coupled to an end of the second frame away from the buckle, and rotationally coupled to the corresponding side plate of the first frame through the rotating shaft; and
  a plurality of buffer members, one end of each of the plurality of buffer members fixed to a bottom surface of the second frame, and another end of each of the plurality of buffer members configured to resist the bottom plate; wherein:
the handle is coupled to the second frame; and
when the handle is separated from the buckle, the handle is pushed or pulled along the rails to remove the second frame from the accommodation space or press the second frame into the accommodation space.

10. The server of claim 9, wherein:
the frame structure further comprises a torsion spring;
one end of the torsion spring is coupled to a side of the second frame, and the other end of the torsion spring is detachably connected to the handle; and
when the buckle is fastened to the handle, the torsion spring is in a compressed state.

11. The server of claim 9, wherein:
the first shaft bracket comprises a first connecting portion, a second connecting portion, and a rotating portion;
the first connecting portion is coupled to a front panel of the second frame, and the second connecting portion is coupled to a bottom surface of a front end of the second frame;
the rotating portion is located between the first connecting portion and the second connecting portion; and
the rotating shaft is installed on the rotating portion.

12. The server of claim 9, wherein:
the second frame further comprises a second shaft bracket fixed on the corresponding side plate; and
the first shaft bracket is rotationally coupled to the second shaft bracket through the rotating shaft.

13. The server of claim 9, wherein:
a groove is in an end of the handle;
the buckle comprises a protrusion; and
when the handle is engaged with the buckle, the protrusion is received in the groove.

14. The server of claim 13, wherein:
an end of the buckle away from the protrusion is provided with a restoring member; and
one end of the restoring member is coupled to the buckle, and the other end of the restoring member abuts the first frame.

15. The server of claim 13, wherein:
the buckle further comprises a pushing portion and an indication arrow;
the pushing portion protrudes from a surface of the buckle facing the side plate; and
the indication arrow indicates an unlocking direction of the buckle.

16. The server of claim 9, wherein:
the handle further comprises a roller located at an end of the handle coupled to the rail; and
the roller is movably disposed in the rail.

* * * * *